(12) United States Patent
Studer et al.

(10) Patent No.: US 12,379,415 B2
(45) Date of Patent: Aug. 5, 2025

(54) TEST SYSTEM AND MAIN DEVICE AND ADDITIONAL DEVICE THEREOF FOR TESTING AN ELECTRIC DEVICE

(71) Applicant: Omicron electronics GmbH, Klaus (AT)

(72) Inventors: Klaus Studer, Blons (AT); Reinhard Kaufmann, Thüringerberg (AT); Michael Rädler, Klaus (AT); Boris Unterer, Feldkirch (AT); Wernich De Villiers, Dornbirn (AT); Matthias Kukuk, Lauterach (AT); Felix Feustel, Dornbirn (AT); Lukas Bitschnau, Braz (AT); Horst Schedler, Rankweil (AT)

(73) Assignee: Omicron electronics GmbH, Klaus (AT)

( * ) Notice: Subject to any disclaimer, the term of this patent is extended or adjusted under 35 U.S.C. 154(b) by 109 days.

(21) Appl. No.: 17/998,220

(22) PCT Filed: May 11, 2021

(86) PCT No.: PCT/EP2021/062460
§ 371 (c)(1),
(2) Date: Nov. 8, 2022

(87) PCT Pub. No.: WO2021/228841
PCT Pub. Date: Nov. 18, 2021

(65) Prior Publication Data
US 2023/0228817 A1    Jul. 20, 2023

(30) Foreign Application Priority Data
May 13, 2020    (AT) ............................. A 50416/2020

(51) Int. Cl.
*G01R 31/327* (2006.01)
*G01R 1/02* (2006.01)
(Continued)

(52) U.S. Cl.
CPC ....... *G01R 31/3272* (2013.01); *G01R 1/0416* (2013.01); *G01R 31/16* (2013.01)

(58) Field of Classification Search
CPC ...... G01R 31/16; G01R 31/3272; G01R 1/02; G01R 1/04; G01R 1/0416; G01R 1/067; G01R 1/073; G06F 1/16
See application file for complete search history.

(56) References Cited

U.S. PATENT DOCUMENTS

| 5,131,272 A | 7/1992 | Minei et al. |
| 6,418,389 B2 | 7/2002 | Peter et al. |

(Continued)

FOREIGN PATENT DOCUMENTS

| CN | 207408530 | 5/2018 |
| CN | 110940837 | 3/2020 |

(Continued)

OTHER PUBLICATIONS

Translation of Search Report, counterpart Russian App. No. 2022132369 (May 30, 2023) (2 pages).

(Continued)

*Primary Examiner* — Neel D Shah
(74) *Attorney, Agent, or Firm* — Cook Alex Ltd.

(57) ABSTRACT

A test system (10) for testing an electric device (30), in particular a high-voltage device, has a portable main device (100) with a housing (140), an electric connection assembly (120, 121) and a mechanical connection assembly (145) and has a portable additional device (200, 300) with a separate housing (240, 340), an electric connection assembly (220, 320) and a mechanical connection assembly (245). The main device (100) can be mechanically connected to the additional device (200, 300) in a releasable manner by coupling the mechanical connection assemblies (145, 245) to form a structural unit, wherein the main device (100) can be elec- (Continued)

trically connected to the additional device (200, 300) via the first electric connection assemblies (120, 121, 220, 320).

18 Claims, 3 Drawing Sheets

(51) Int. Cl.
    *G01R 1/04*     (2006.01)
    *G01R 1/067*     (2006.01)
    *G01R 1/073*     (2006.01)
    *G01R 31/16*     (2006.01)
    *G06F 1/16*     (2006.01)

(56) References Cited

U.S. PATENT DOCUMENTS

| | | | |
|---|---|---|---|
| 6,462,961 B1 * | 10/2002 | Johnson | H05K 7/1421 361/825 |
| 6,608,493 B2 | 8/2003 | Hensler et al. | |
| 9,366,711 B2 | 6/2016 | Klapper | |
| 10,955,490 B2 | 3/2021 | Kaufmann et al. | |
| 10,989,766 B2 | 4/2021 | Böhler et al. | |
| 2004/0047116 A1 * | 3/2004 | Dighde | H05K 7/14 361/679.02 |
| 2012/0178303 A1 | 7/2012 | Sakurai | |
| 2016/0080666 A1 | 3/2016 | Stuart et al. | |

FOREIGN PATENT DOCUMENTS

| | | |
|---|---|---|
| EP | 2477002 | 7/2012 |
| EP | 3267211 | 1/2018 |
| RU | 2712983 | 2/2020 |

OTHER PUBLICATIONS

International Search Report with English translation, counterpart International App. No. PCT/EP2021/062460 (Aug. 18, 2021) (5 pages).

Written Opinion, counterpart International App. No. PCT/EP2021/062460 (Aug. 18, 2021) (6 pages).

* cited by examiner

TEST SYSTEM AND MAIN DEVICE AND ADDITIONAL DEVICE THEREOF FOR TESTING AN ELECTRIC DEVICE

The present application is a U.S. National Stage of PCT International Patent Application No. PCT/EP2021/062460, filed May 11, 2021, which claims priority to Austrian Application No. A50416/2020, filed May 13, 2020, both of which are hereby incorporated herein by reference.

FIELD OF THE INVENTION

The invention relates to a test system for testing an electric device operated with an electric voltage or an electric current, a portable main device and a portable additional device for testing such an electric device, and a hybrid cable for connecting a portable main device to a portable additional device.

In particular, the invention is in the field of high-voltage and high-current measurement technology and relates in particular to a test system for testing a high-voltage device, a portable main device and a portable additional device for testing a high-voltage device and a hybrid cable for connecting a portable main device to a portable additional device.

BACKGROUND

In electric energy supply grids, high-voltage devices or more generally electrical energy devices such as power transformers or switch gears are commonly used to convert and distribute electrical energy. Here, further electrical energy devices such as high-voltage converters or high-current converters, circuit breakers, power generators or relays are habitually used to generate and distribute electric energy or as components of a protection system. Such electrical energy devices or, further, electrical energy devices such as electric motors are used in the industrial setting too.

To put into operation or to maintain facilities with such high-voltage devices, it is necessary to examine their functions and characteristics, wherein suitable test signal is applied to the respective test object and the resulting test response of the test object is recorded and evaluated to measure a corresponding measurement variable. Examples of this are measurements of electric contact resistances, of the switching characteristics, of the conducting characteristics, of the transformation ratio or of the loss factors of such a test object and isolation measurements or partial discharge measurements, etc.

Such tests are frequently carried out in the field—i.e. outdoors or in an industrial environment. In this case, in particular for use in the field, the equipment used should be light, be able to be employed flexibly and be robust for transportation to the relevant location of use.

SUMMARY OF THE INVENTION

There is therefore a need for a test system for testing an electric device, in particular a high-voltage device, which is easy to transport and which has a good performance capacity and a large scope of functions and which also provides a high degree of operational safety.

The invention meets this need through a test system for testing an electric device according to claim 1 or claim 16.

Advantageous embodiments, further developments and variants of the present invention are the subject-matter of the dependent claims.

The invention can preferably be used to test a high-voltage device, but is not limited to this. The invention can also likewise be used to examine operating equipment in the low-voltage range or medium-voltage range, i.e. generally in all voltage levels.

The test system formed for testing an electric device includes a portable main device with a housing and a mechanical connection assembly disposed on the housing or a corresponding connection mechanism and an electric connection assembly or electric plug interface disposed on the housing. Furthermore, the test system includes a portable additional device which is separate from the portable main device and which has a housing and a mechanical connection assembly disposed on this housing, and an electric connection assembly disposed on this housing. The portable main device can be mechanically connected to the portable additional device in a releasable manner, to form a structural unit, by coupling the mechanical connection assemblies, with it being possible to produce an electric connection between the portable main device and the portable additional device via the electric connection assemblies.

The invention is preferably formed for testing an electric high-voltage device. In the terms of the invention, "high-voltage device" should be understood here to be any device which is operated with a high electric voltage, i.e. a voltage in the range of at least 1 kV, or a correspondingly high electric current.

Furthermore, in the terms of the invention, "portable" should at least be understood to mean that the system and the corresponding device can be transported, and in particular can be worn, by a user.

An advantage of the portable main device and of the portable additional device, each with separate housings, is in particular that these can each be transported individually to the respective location of use—in particular when being used in the field. It is also made possible to expand the functionality of the test system via different additional devices—depending on the measurements/tests to be carried out.

Both the main device and the additional device can, according to a preferred design example, each be formed as an independent testing device, in particular as a high-voltage testing device, with a test system with variable functioning and/or an expanded scope of functions being obtained by coupling the main device to the additional device, with this test system appearing outwardly as a structural unit with a correspondingly formed combination measuring device. If the coupling between the main device and the additional device is released, the main device and the additional device can each be operated again as separate measuring devices.

When the main device is coupled to the additional device, the main device can, in particular, take over the control of the generation of a test signals for the electric device to be tested or the automatic control of the sequence of the entire test and can have a correspondingly formed controlling device for this purpose.

Likewise, the main device can have a power-amplifying device which generates a power signal which is transmitted to a test signal apparatus of the additional device in order to generate, depending on this, in the additional device, the test signal to be outputted to the electric device to be tested, in particular a high-voltage test signal with a voltage of at least 1 kV.

The test response by the electric device, which is to be tested, to the test signal is preferably evaluated by a measuring device of the main device for measuring a desired measurement variable of the electric device, wherein the test response can be recorded by the additional device and transmitted to the main device for this purpose. In this case, the additional device is thus equipped with all measurement inputs and measurement outputs in order to be able to carry out the measurement itself. This approach can in particular be recommended when testing voltage converters, in particular high-voltage converters. However, it is likewise also possible for the test response to be recorded and evaluated directly by the main device. The latter approach can be recommended for testing current converters in particular high-current converters.

When coupling the main device to the additional device, it is possible to obtain a compact and manageable structural unit in particular if the main device and the additional device have identical or substantially similar dimensions on their contact surfaces, at which they can be mechanically coupled or connected to one another via the mechanical connection assemblies. The main device and the additional device preferably have the same form factor, i.e. have the same or substantially similar external dimensions.

If the arrangement of the electric connections is suitably chosen, the portable main device and the portable additional device can be connected even with just (precisely) one cable for the testing of the electric device. This can make handling—especially in the field—simpler and/or more reliable. The cable can be formed in the form of a hybrid cable, with both power signals and data signals and/or safety signals being able to be transmitted between the portable main device and the portable additional device via the cable. In particular, the hybrid cable is formed such that the different signals or items of information can be transmitted at the same time. For this purpose, separate wires can be provided in the hybrid cable for each type of signal, but with it also being possible for different signals or items of information to be transmitted via a common wire.

In one embodiment, the portable main device can be formed without a power transformer or high-voltage transformer/high-current transformer, but the power transformer is—insofar as such a power transformer is required for the test system to carry out certain tests—only provided in the relevant portable additional device. In this advantageous manner, the weight of the portable main device can be reduced and/or the test system—where necessary modularly divided into several parts such as the main device and the additional device—can be transported more easily.

By using the main device and the separate additional device it is generally possible to divide the functions of the desired test system between the main device and the additional device such that overall the variability and flexibility, and also the operational safety, can be increased. When using the main device with a set of several different additional devices, which each have different functions and/or components, it is possible to obtain, by selecting that additional device suitable in each case, a modularly constructed test system whose functionality is best suited to the relevant circumstances on site and to the respective desired test conditions.

Further advantages, features and possible application emerge from the following detailed description of design examples and/or from the figures.

BRIEF DESCRIPTION OF THE FIGURES

The invention will be explained in greater detail hereafter with reference to the figures using advantageous design examples. Identical elements or structural members in the design examples are each provided with the same reference numbers, unless otherwise described or unless the context reveals differently.

The figures are schematic depictions of different embodiments and/or design examples of the present invention. Elements and/or structural members depicted in the figures are not necessarily depicted true to scale. On the contrary, the different elements and/or structural members depicted in the figures are reproduced such that their function and/or their purpose can be understood by the person skilled in the art.

Connections and couplings, depicted in the figures, between functional units and elements can also be implemented as indirect connections or couplings. In particular, data connections can be formed to be wired or wireless, i.e. in particular as a radio connection. For the sake of clarity, certain connections, such as electric connections, such as for supplying energy, may also not be depicted.

DETAILED DESCRIPTION OF DESIGN EXAMPLES

The invention will be described hereafter by means of testing a high-voltage device, but without being restricted thereto. The invention can also likewise be used to examine operating equipment in the low-voltage range or medium-voltage range, i.e. generally in all voltage levels.

Figure 1:
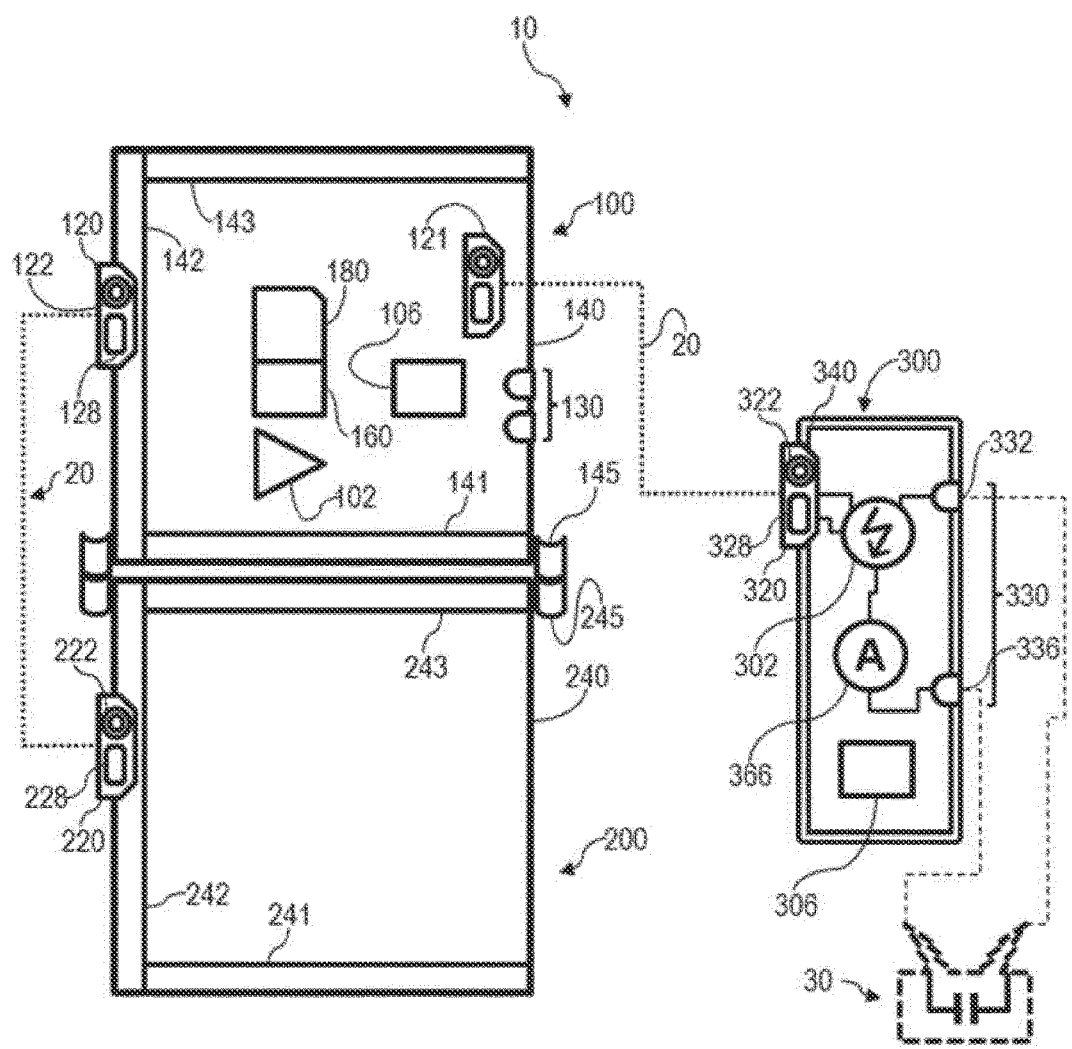
FIG. 1 shows a test system according to one embodiment.

FIG. 1 schematically depicts a test system 10 according to one embodiment of the present invention for testing a high-voltage device, i.e. an electric device which operates with a high electric voltage or rather with an appropriately high electric current.

In one design example, the test system 10 has a portable main device 100 and a portable additional device 300 and a further portable additional device 200, which are connected to one another via one hybrid cable each—in some variants one hybrid cable 20 of the test system 10 each.

FIG. 1 furthermore also depicts the high-voltage device 30 to be tested.

The portable main device 100 has a housing 140 with a floor surface 141, a side surface 142 and an upper side 143. The floor surface 141 is intended to face a subsurface when the portable main device 100 is placed on it. Correspondingly, the portable additional device 200 has a housing 240 with a floor surface 241, a side surface 242 and an upper side 243. The portable additional device 300 also has a housing 340, with this, in some variants, being able to correspond to the housing 240 of the portable additional device 200 with corresponding electric connections and mechanical connecting elements and with further details not being depicted, for the sake of clarity.

Furthermore, the housings 140, 240 of the portable main device 100 and of the portable additional device 200 each have mechanical connecting elements 145, 245, which are arranged to connect the portable main device 100 to this additional device 200 in a releasable manner, in particular in a force-fitting, form-fitting or friction-locking manner, when it is placed by its floor surface 141 onto the upper side 243 of this additional device 200. In this advantageous manner, the main device 100 and the additional device 200 can be mechanically connected to one another—such as in the field—as a result of which in particular an operation of the portable main device can be facilitated and/or the handling of the test system 10 can be improved.

In the design example depicted in FIG. 1, the main device 100 is placed onto the additional device 200, so that the floor surface 141 of the main device 100 is located on the upper side 243 of the additional device. The dimensions of the floor surface 141 and of the upper side 243 are preferably such that they largely correspond to one another such that overall a compact unified construction can be obtained when the main device 100 is coupled to the additional device. As is indicated in FIG. 1, the individual devices 100, 200, 300 can generally largely have the same form factor, i.e. the same external dimensions.

Each of the devices 100, 200, 300 is preferably formed as an independent measuring device.

In this regard, the portable main device 100 has a connection assembly 120, a further connection assembly 121 and one or more test connections 130 for connecting the high-voltage device 30, which are disposed on the housing 140. The connection assembly 120 (and correspondingly the further connection assembly 121) preferably only has connections 122, 128, which are all spaced apart from one another by less than a predetermined spacing such that these can all be connected to precisely one end of the hybrid cable 20. As a result, connection of the hybrid cable can be facilitated and any tangle of cables can be avoided compared to other systems with several cables or larger spacings and thus safety can be improved. A first group 122 of the connections of the connection assembly 120 is arranged to output a power signal and a second group 128 of the connections of the connection assembly 120 is arranged for data communication. In addition, a further group of connections (not shown) for transmission of safety signals can be provided in order to thus control safety functions of the test system.

The further portable additional device 200 has a corresponding connection assembly 220 that is disposed on the side surface 242. The connection assembly 220 preferably also has connections 222, 228, which are all spaced apart from one another by less than the predetermined spacing. A first group 222 of the connections of the connection assembly 220 is arranged to receive the power signal and a second group 228 of the connections of the connection assembly 220 of the further portable additional device 200 is arranged for data communication and or for transmission of the safety signals. One of the hybrid cables 20 is connected by one end to the connection assembly 120 of the portable main device 100 and by another end to the connection assembly 220 of the further portable additional device 200 and thus connects the main device 100 and the further additional device 200.

The portable additional device 300 accordingly has one or more test connections 330 and a connection assembly 320, which are disposed on the housing 340 of the portable additional device 300. A first group 322 of connections of the connection assembly 320 is arranged to receive the power signal and a second group 328 of connections of the connection assembly 320 is arranged for data communication and/or for transmission of the safety signals, with these connections preferably all being spaced apart from one another by less than the predetermined spacing.

The portable additional device 300 (and correspondingly in some variants the further portable additional device 200) is operable in a test mode and is arranged in this to convert the received power signal into a first test signal and to apply it, via an output connection 332 of the test connections 330 of the portable additional device 300, to the high-voltage device 30 which is to be connected there.

Furthermore, the portable main device 100 has a power-amplifying device 102 for generating the power signal, a measuring device 160 for measuring measurement variables and a controlling device 180 for controlling the power-amplifying device 102 and the measuring device 160—and in some variants a timer 106 arranged to provide a time signal—which are each disposed inside the housing 140 of the main device 100.

The portable additional device 300 is in some variants, as also depicted in FIG. 1, formed as a high-voltage test signal apparatus and has a high-voltage transformer 302, a current sensor device 366 and a timer 306 arranged to provide a time signal, which are each disposed in the housing 340 of the portable additional device 300. In addition, the controlling device 180 of the portable main device 100 is arranged to trigger, for a first testing of the high-voltage device 30, the portable additional device 300 via the connection assembly 121 and the connection assembly 320 through one of the hybrid cables 20 such that the portable additional device 300 is induced to activate the test mode of the portable additional device 300. Moreover, the controlling device 180, for the first testing, is arranged to generate the power signal by means of the power-amplifying device 102 and to output it to the portable additional device 300 via the connection assemblies 121, 320.

The high-voltage test signal apparatus—i.e. the portable additional device 300—is arranged, in the test mode, to convert the power signal into the first test signal by means of the high-voltage transformer 302 such that the power signal and the first test signal are electrically isolated and the first test signal possesses a voltage suitable for high-voltage testing, of at least 1 kV.

Furthermore, the portable additional device 300 is arranged, in the test mode, to receive a first analogue measurement signal, which is generated as a result of the first test signal, via a measurement input 336 of the test connections 330 and to digitally transmit a data signal, which characterises the first measurement signal, through one of the hybrid cables 20 to the portable main device 100 in an electrically isolated manner via the connection assembly 320 and the connection assembly 121. The portable main device 100 and the portable additional device 300 can also be positioned spatially separated from one another, as a result of which the operational safety can be increased in particular in combination with the electrical isolation.

In an alternative embodiment, the connection assemblies 120, 121, 220, 320 are realised by a booster plug or booster connection.

In alternative variants, the additional device 300 can also have a digital measurement input for receiving a correspondingly digital measurement signal and/or can transmit an analogue data signal. The digital transmission of the data signal can in particular have the advantage that the electrical isolation can be implemented more easily and/or with greater precision and/or that interference in the measurement signal and thus in the measuring or testing can be avoided or at least reduced. Here, the sensor device 366 can be arranged to record and digitise the first analogue measurement signal received at the measurement input 336 and to provide it as the data signal.

Finally, the controlling device 180 is arranged to measure, for the first testing by means of the measuring device 160, a first measurement variable which is based on the first measurement signal. For a loss factor measurement with regard to the high-voltage device 30, the analogue measurement signal is an alternating current which flows through an isolating agent of the high-voltage apparatus 30 when alternating voltage is applied, with, as measurement variables, at least the amplitude or the effective value of the alternating current and the phase position of the alternating current relative to the applied alternating voltage being measured or the temporally determined signal progression of the alternating current being measured.

In some variants, the controlling device 180 is additionally arranged to execute a communication protocol, which safeguards against malfunctioning, for data communication via the second group 128 of the connections of the connection assembly 120 and, if a certain error arises during the data communication, to activate an error mode of the portable main device, in which no power signal is outputted via the first group 122 of the connections or in which the controlling device 180 induces the portable additional device 300 to activate an error mode of the portable additional device. Thus, for instance if the data communication is interrupted, this can be detected on the basis of the communication protocol, which safeguards against malfunctioning, and as a result the power signal can no longer be outputted, as a result of which the operational safety can be increased. If, for instance, data communication is delayed by more than a predetermined period of time, the error mode of the additional device 300 can also be activated, wherein this additional device can be arranged in that case to no longer output a test signal or to detach the high-voltage device 30 from the test connections 330 or to discontinue the recording of the measurement signal or to no longer send it to the portable main device 100 as a data signal, which allows the operational safety to be increased and/or allows the reliability or precision of tests or measurements to be increased.

Likewise, when the aforementioned safety signals are being transmittted via the hybrid cable 20, when the appropriate conditions are met, safety functions of the test system can be triggered and, for example, components of the main device 100 or of the additional devices 200, 300 can be deactivated, in order to increase operational safety.

In some variants, the main device 100 and the additional device 300 (or also the additional device 200) can be arranged to synchronise to one another. Here, the main device 100 is arranged to output a synchronisation signal via the second group 128 of the connections of the connection assembly 120 for the purpose of synchronisation. In addition, the timer 106 of the main device 100 and the timer 306 of the portable additional device 300 are arranged to align their respective time signals based on the synchronisation signal such that a time difference between these is smaller than a predetermined period of time. In some variants, the portable main device 100 and the portable additional device 300 are arranged to be synchronised by means of the IEC 1588 protocol, with, in some variants thereof, a data communication required for this taking place via the second group 128 of the connections of the connection assembly 120 and via the second group 328 of the connections of the connection assembly 320.

In some variants, the portable main device 100—advantageously in combination with a temporal synchronisation and/or a communication protocol safeguarded against malfunction—is arranged to generate the power signal in real-time or to control the portable additional device 300 via the connection assembly 121 in real-time so that the portable additional device 300 generates a test signal, and is furthermore arranged to measure, in real time, a measurement variable based on a measurement signal generated as a result of the test signal.

In variants in which the portable additional device 300 is arranged to record a measurement signal and in particular to digitise an analogue measurement signal, the portable additional device 300 in some advantageous variants is arranged to provide the measurement signal or digitised measurement signal with a time code, which characterises a time of recordal of the signal and which is based on the time signal of the internal timer 306, and to provide this time-code-equipped signal as a data signal via the connection assembly 320 and in particular the connections of the second group 328 for the portable main device 100.

In some advantageous variants, for a multiphase high-voltage device, the portable main device 100 and/or the additional device 300 or the further additional device 200 have further channels with further test connections—such as output connections or measurement connections—for the multiple phases of the high-voltage device so that a multiphase testing—for instance, of the isolation resistance, of the loss factor or of the transformation ratio—can be performed without changing the cabling and thus in a more efficient and/or safer manner.

Figure 2:
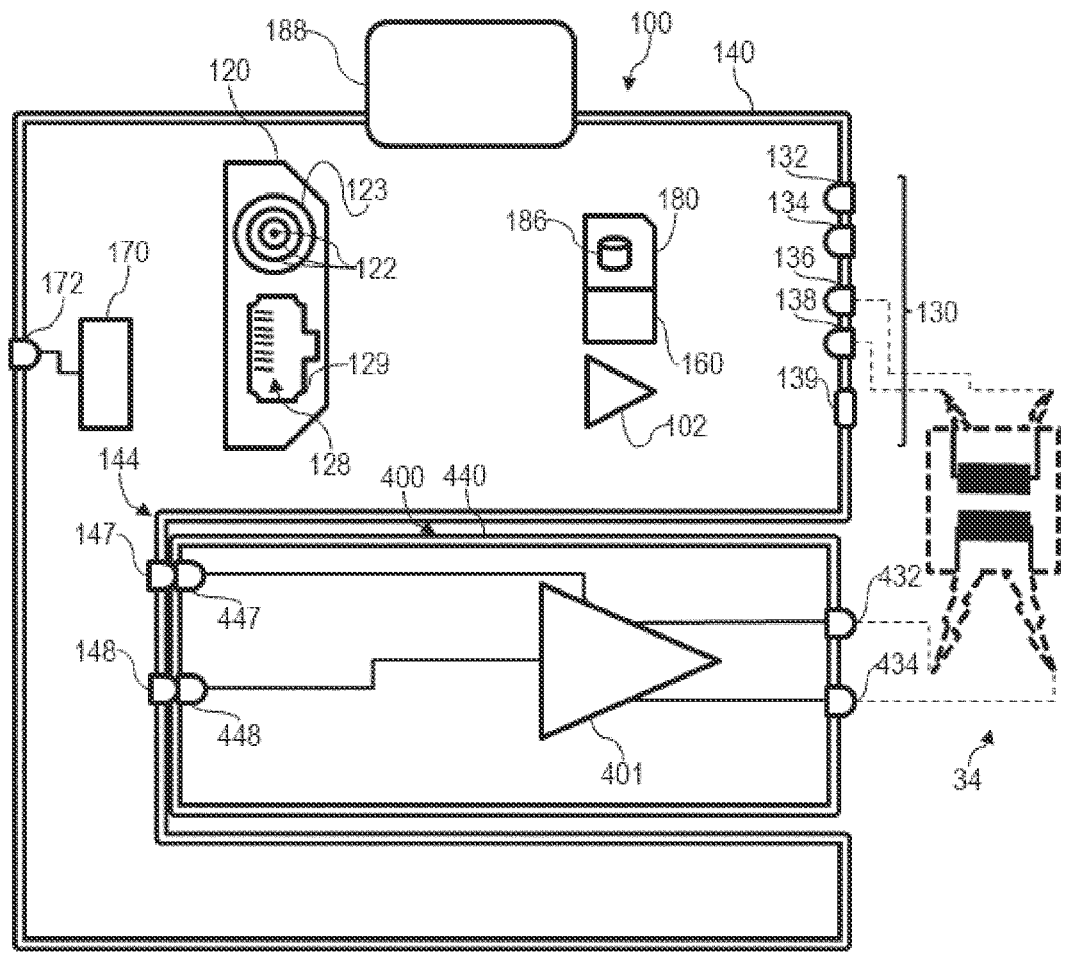
FIG. 2 shows a portable main device according to one embodiment.

FIG. 2 schematically shows a portable main device 100 according to one embodiment of the present invention for testing an electrical energy device or high-voltage device. In this case, the portable main device 100 can be formed in accordance with the portable main device from FIG. 1 or in accordance with the description with regard to FIG. 1 and in particular can also have mechanical connecting elements, which, for the sake of clarity, are not depicted in FIG. 2, since FIG. 2 substantially relates to the internal design and the operating mode of the main device 100.

The portable main device 100 has a housing 140 and an electric connection assembly 120 disposed on the housing 140 for the connecting of a portable additional device, wherein the connection assembly 120 preferably only has connections 122, 128 which are all spaced apart from one another by less than a predetermined spacing such that these can be connected with precisely one end of a cable. In this case, the connection assembly 120 has a first socket 123 which contains a first group 122 of the connections of the connection assembly 120 for outputting a power signal, and has a second socket 129 which contains a second group 128 of the connections of the connection assembly 128 for data communication. In alternative variants, the portable main device 100 or the connection assembly 120 can also have other electric connecting elements, for instance a plug or a joint plug or a joint socket in each case, instead of the first or second socket 123, 129.

FIG. 2 furthermore also depicts the high-voltage device 34 to be tested.

The portable main device 100 furthermore has several test connections 130 for connecting the high-voltage device 34, which are disposed on the housing 140. In addition, the main device 100 has a power-amplifying device 102 for generating the power signal and a test signal, a measuring device 160 for measuring measurement variables and a controlling device 180 for controlling the power-amplifying device 102 and the measuring device 160, and a storage device 186 for storing the measurement variables, which are each disposed inside the housing 140. An advantage of variants with an integrated measuring device 160, controlling device 180 and power-amplifying device 102 can in particular be that such a main device 100 can already provide the full measuring functionality and, by means of the power-amplifying device 102, can also already provide a test current for some tests on a high-voltage device or on an electrical energy device, or a corresponding test signal or a corresponding test voltage, with which some tests can be performed in particular even without a portable additional device. Advantageously, by means of the storage device 186, measured measurement variables can be stored, in particular automatically—for instance, for later evaluation or logging—, by means of which, in particular, the handling of the main device 100 and/or of a test system having such a main device can be improved. Alternative variants thereof may also have no such storage device.

In some variants, the test connections 130 are separate from the connections 122, 128 of the connection assembly 120, i.e. in particular separate from the first socket 123 and from the second socket 129, as a result of which, in particular, the handling can be simplified and/or the operational safety can be increased.

For carrying out tests without additional devices or expansion modules, in particular for a second testing of the high-voltage device 34, the test connections have a first output connection 132, a second output connection 134, a first analogue measurement input 136 and a second analogue measurement input 138. In some variants, the portable main device 100 can furthermore have a digital interface 139, with this being able to be formed as part of the test connections 130 as a digital measurement input 139 in some variants thereof. Alternative variants can also have only one output connection and can have an analogue measurement input or a digital measurement input as the measurement input.

For the second test, the controlling device 180 is arranged to generate, by means of the power-amplifying device 102, a second test signal with a suitable current or a suitable voltage and to apply it to the high-voltage device 34 which is to be connected to the output connections 132, 134 and to measure a second measurement variable by means of the measuring device using a second electric analogue measurement signal which fits on or between the analogue measurement inputs 136, 138, in the case of a high-voltage device 34 also connected there, as a consequence of the second test signal.

In an alternative or additional variant with a digital measurement input 139, the controlling device 180 and the measuring device 160 are arranged to measure, for the second test, the second measurement variable using a second measurement signal, which is generated as a consequence of the second test signal and transmitted to the digital measurement input. In the case of a measuring transformer to be tested, for a transformation ratio measurement as the second test, a primary side of this measuring transformer, for instance, can be connected to the output connections 132, 134, a test current can be generated as the second test signal by means of the power-amplifying device 102 and can be fed into the measuring transformer via the output connections 132, 134 and finally a value of current recorded by the measuring transformer, which is generated as a consequence of the fed-in test current and outputted via a digital interface of the measuring transformer, can be received via the digital measurement input 139 and measured by means of the measuring device 160, with the measuring device 160 further measuring or determining the transformation ratio based on the fed-in current and the measured value of current.

For the second testing or for a further testing, in some variants the controlling device 180 and the digital interface 139 are arranged to send control signals to a further component of a test system or a component of the electrical energy device to be tested and, as a consequence, to receive generated (further) digital measurement signals from this component or from an even further component, with the measuring device 160 or the controlling device 180 being arranged to evaluate these further digital measurement signals. In some variants thereof, the portable main device 100 is arranged to communicate by means of the IEC 61850 protocol.

In some variants, the portable main device 100 has an energy supply device 170, in particular inside the housing 140, and has a mains connection 172 disposed on the housing 140. In this case, the portable main device 100 is arranged to supply electrical energy from the power supply to the portable main device itself and to additional devices connected via the connection assembly 120 or to additional devices or expansion modules connected via further connections, when the power supply is connected to the mains connection 172. For this purpose, in some advantageous variants, the second group 128 of the connections of the connection assembly 120 of the portable main device 100 is additionally arranged to supply energy to the portable additional device which is to be connected. In alternative variants, the portable main device and/or additional devices or expansion modules can also be supplied with electrical energy via an external energy supply device or via a respective energy supply device of the respective additional device or expansion module.

In some variants, the connection assembly 120 for the second group 128 of connections, and in particular as a second connecting element 129, has an EtherCAT interface. In this case, the controlling device 180 is arranged to communicate, by means of an EtherCAT protocol via the EtherCAT interface 129, with a portable additional device which is to be connected to the connection assembly 120. In advantageous variants thereof, the EtherCAT interface is furthermore arranged to supply the portable additional device with electrical energy by means of Power-over-Ethernet.

In some variants with a timer and/or with a communication protocol safeguarded against malfunction, the portable main device 100 has an interface for a protocol in accordance with IEC 1588, with the controlling device 180 being arranged to serve as a pulse generator for the purpose of synchronisation for communication applications with conventional and/or with digital sub-stations.

Through variants in which the power-amplifying device 102 is arranged to generate freely adjustable signal forms as the power signal or as a test signal, a direct current and/or one or more alternating currents or a direct voltage and/or one or more alternating voltages can advantageously be superimposed, by means of which in particular the time for a measuring sequence with at least substantially identical precision can be shortened or non-linear effects can be measured—for instance in the case of a "Power Quality Measurement". It is also advantageously made possible to adapt the portable main device for different tests to be carried out, by setting or selecting a signal form suitable for the relevant test, as a result of which flexibility can be increased compared to solutions with firmly specified signal forms—for instance only direct voltage or only alternating voltage with specific amplitudes or frequencies—and/or the handling can be improved.

In some advantageous variants with a storage device 186, the measuring device 160 and the controlling device 180 are arranged to determine measurement variables or variables derived therefrom for the testing of the high-voltage device or electrical energy device based on an electro-physical model of the high-voltage device/electrical energy device, with the measurement variables or further variables being numerically optimised as parameters of the electro-physical model. In this case, several runs of such a test or results of several different tests regarding the high-voltage device/ electrical energy device can be combined, as a result of which in particular the precision of the test/measurement, i.e. in particular the measurement variables or further variables determined in this manner, can be increased. Alternatively or in addition, the measurement variables or further variables can also be determined using a conventional approach in which in particular the values to be determined can be determined from recorded measurement values without numerical optimisation, for instance in particular directly by means of a clearly solvable formula.

As depicted in FIG. 2, the housing 140 of the main device 100 furthermore has a module space 144 for accommodating and connecting to an expansion module. In this case, the portable main device 100 is arranged to supply energy to an expansion module accommodated in the module space 144 and to control it by means of the controlling device 180.

In addition, FIG. 2 shows a high-current module for testing the electrical energy device 34 using a test current, with the portable main device 100 having this high-current module 400 as the expansion module and with a housing 440 of the high-current module 400 being arranged for the module space 144 and, for this purpose, being formed in some variants for a form-fit with the module space 144. In alternative variants, the portable main device 100 can also have other expansion modules or no expansion module or additional module spaces. To supply with electrical energy, the module space 144 has a plug connection element 147 and the expansion module or high-current module 400 has a plug connection element 447 which corresponds to it and which is disposed on the housing 440. For control by means of the controlling device, the module space 144 has a further plug connection element 148 and the expansion module 400 has a further plug connection element 448 which corresponds to it and which is disposed on the housing 440. Furthermore, the high-current module 400 has a high-current source 401 inside the housing 440 and has a first and a second high-current connection 432, 434 disposed on the housing 440. The high-current module 400 can be arranged to generate, controlled by the controlling device 180 for a third test, a high-current signal by means of the high-current source 401 and to provide it to the high-current connections 432, 434 as a test signal.

Furthermore, in some variants the portable main device 100 has a user interface 188, which is disposed on the housing 140 and which is arranged to record inputs by a user and, on the basis of these, to induce the controlling device 180 to carry out testing of the high-voltage device or the electrical energy device 34, and to output for the user one or more measurement variables measured when performing the test. A sequence of tests can also be performed, wherein advantageously the measured measurement variable and further parameters, characteristics or functions of the high-voltage device or of the electrical energy device are determined on the basis of a model, i.e. in particular with an electro-physical model into which recorded measurement values from multiple tests are fed in.

In this case, the controlling device 180 is arranged to control the power-amplifying device 102 and, for additional tests, any portable additional devices or expansion modules respectively such that they generate a test signal or power signal which is suitable in each case. In addition, in this case, the controlling device 180 is arranged to measure one or more corresponding measurement variables by means of the measuring device 160 and any additional devices or expansion modules and to save the measurement variables by means of the storage device 186.

Figure 3:
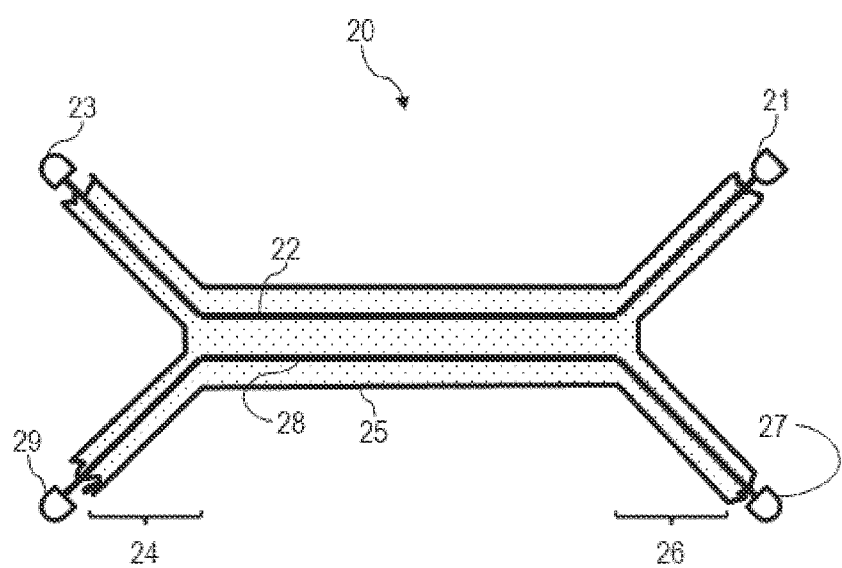
FIG. 3 shows a hybrid cable according to one embodiment.

FIG. 3 schematically shows a hybrid cable 20 according to one embodiment of the present invention for connecting a portable main device to a portable additional device.

In one design example, the hybrid cable 20 has at least one wire 22 for the transmission of a power signal and at least one wire 28 for data communication and/or for the transmission of a safety signal. In addition, the hybrid cable 20 has a first electric connecting element 23, arranged at an end 24 for the portable main device, for releasable connection to a first electric connection element—for instance the connection element 123 from FIG. 2—a connection assembly of the portable main device. Furthermore, the hybrid cable has a first electric connecting element 21, arranged at a different end 26 for the portable main device, for releasable connection to a first electric connection element of a connection assembly—for instance the connection assembly 220 or 320 from FIG. 1—of the portable additional device.

In some variants, the hybrid cable 20 has at least one grounding wire. In some variants thereof, the first electric connecting elements 21, 23 are arranged to also electrically connect the grounding wire to corresponding connections from the connection assembly of the portable main device and from the connection assembly of the portable additional device in a releasable manner. In alternative variants thereof, the hybrid cable 20 has, at the end 24 and/or at the end 26 in each case a further electric connecting element for the grounding wire.

As depicted, the hybrid cable 20 furthermore has a second electric connecting element 29, arranged at the end 24 for the portable main device, for connection to a second electric connection element of the portable main device—for instance the electrical connection element 129 from FIG. 2. Furthermore, the hybrid cable 20 has a second electric connecting element 27, arranged at the end 26 for the portable additional device, for connection to a second electric connection element of the connection assembly of the portable additional device. In this case, the second connecting elements 24, 27 are arranged to electrically connect, in a releasable manner, the wires 28 for data communication or security signal transmission at the end 24 for the portable main device with corresponding connections—for instance the second group 128 of connections from FIG. 1—of the connection assembly of the portable main device and to electrically connect them, in a releasable manner at the end 26 for the portable additional device with corresponding connections—for instance the connections 228 or 328 from FIG. 1—of the connection assembly of the portable additional device.

In some variants, the electric connecting elements 21, 23, 27, 29 are each formed as plugs. Alternatively, in particular to increase the safety, the first electric connecting element 21 at the end 26 can also be formed as a socket, so that it has no exposed contacts and thus protects any present power signal from being touched. The second electric connecting element 27 at the end 26 can also be formed as a socket, so that, in combination with an electric connecting element 21 formed as a socket, several such hybrid cables can be connected to one another to obtain a longer hybrid cable.

In alternative variants, the hybrid cable can have at each end 24, 26 in each case only the respective first electric connecting element, wherein these are arranged to additionally electrically connect, in a releasable manner, the wires 28 for data communication and/or security signal transmission at the end 24 with corresponding connections of the connection assembly of the portable main device and to electrically connect them, in a releasable manner at the end 26 for the portable additional device with corresponding connections of the connection assembly of the portable additional device. In this variant, the hybrid cable can then have hybrid plugs both for the portable main device at the end 24 and for the portable additional device at the end 26, in which hybrid plugs the functions of the connecting elements 23 and 29 and 21 and 27 are integrated in each case, i.e. all wires and connections are then formed in one cable 20 and in only one plug or connecting element in each case at both ends 24, 26.

The hybrid cable 20 has a cable sheath 25, which, at least in a middle section of the hybrid cable, encases all wires 22, 28 and, at an end section at the end 24, in each case encases the wires 22 and the wires 28 individually and accordingly encases the wires 22, on the one hand, and the wires 28, on the other hand, at an end section at the end 26.

The invention claimed is:

1. A test system for testing an electric device, comprising:
a portable main device with a first housing and a first mechanical connection assembly disposed on the first housing and a first electric connection assembly disposed on the first housing, and
a portable additional device, separate from the portable main device, with a second housing and a second mechanical connection assembly disposed on the second housing and a second electric connection assembly disposed on the second housing,
wherein the portable main device can be mechanically connected to the portable additional device in a releasable manner by coupling the first mechanical connection assembly to the second mechanical connection assembly to form a structural unit,
wherein the portable main device can be electrically connected to the portable additional device via the first electric connection assembly and the second electric connection assembly,
wherein the portable main device has a power-amplifying device for generating a power signal which is to be transmitted to the portable additional device via the first electric connection assembly and the second electric connection assembly,
wherein the portable additional device has a test signal apparatus for generating a test signal, which is to be output to the electric device, on the basis of the power signal of the portable main device, and
wherein the portable main device has a measuring device for measuring a measurement variable of the electric device as a test response to the test signal of the portable additional device.

2. The test system according to claim 1, wherein the portable main device and the portable additional device can be connected in a releasable manner at contact surfaces of the portable main device and of the portable additional device to form the structural unit, wherein dimensions of the contact surface of the portable main device substantially correspond to dimensions of the contact surface of the portable additional device.

3. The test system according to claim 1, wherein the first mechanical connection assembly and the second mechanical connection assembly are formed such that the portable main device can be connected to the portable additional device in a force-fitting, form-fitting and/or friction-fitting manner to form the structural unit.

4. The test system according to claim 1, wherein the first housing of the portable main device and the second housing of the portable additional device have substantially the same dimensions.

5. The test system according to claim 1, wherein the portable additional device has a transformer as the test signal apparatus and is arranged such that the portable additional device converts the power signal of the portable main device into the test signal by means of the transformer such that the power signal and the test signal are electrically isolated and the test signal has a voltage of at least 1 KV.

6. The test system according to claim 1, wherein the portable additional device is configured such that the portable additional device records the test response to the test signal and transmits it to the measuring device of the portable main device.

7. The test system according to claim 1, wherein the portable main device is configured such that the portable main device records the test response to the test signal of the portable additional device and forwards it to the measuring device of the portable main device.

8. The test system according to claim 1, wherein the portable main device has a controlling device for controlling the power-amplifying device and the measuring device.

9. The test system according to claim 8, wherein the controlling device is configured such that, via an electric connection between the first electric connection assembly and the second electric connection assembly, it triggers the test signal apparatus of the portable additional device to generate the test signal to be output to the electric device.

10. The test system according to claim 8, wherein the controlling device is configured such that, via an electric connection between the first electric connection assembly and the second electric connection assembly, it controls the testing of the electric device through the test signal of the portable additional device.

11. The test system according to claim 1, comprising a hybrid cable, which is arranged to electrically connect the portable main device to the portable additional device via the first electric connection assembly and the second electric connection assembly and configured to simultaneously transmit both the power signal and a data signal.

12. The test system according to claim 11, wherein the hybrid cable is additionally configured to simultaneously transmit a safety signal.

13. The test system according to claim 1, wherein the portable main device has an energy supply device and is configured to supply energy to the portable additional device by means of the energy supply device.

14. The test system according to claim 1, wherein both the portable main device and the portable additional device are formed as an independent measuring device.

15. The test system according to claim 1, wherein it is configured to test an electric high-voltage device.

16. A test system for testing an electric device, comprising:
a portable main device with a first housing and a first mechanical connection assembly disposed on the first housing and a first electric connection assembly disposed on the first housing,
a portable additional device, separate from the portable main device, with a second housing and a second mechanical connection assembly disposed on the second housing and a second electric connection assembly disposed on the second housing, and
a hybrid cable, which is arranged to electrically connect the portable main device to the portable additional device via the first electric connection assembly and the second electric connection assembly and configured to simultaneously transmit both a power signal and a data signal, wherein the portable main device can be mechanically connected to the portable additional device in a releasable manner by coupling the first mechanical connection assembly to the second mechanical connection assembly to form a structural unit, wherein the portable main device can be electrically connected to the portable additional device via the first electric connection assembly and the second electric connection assembly, and wherein the hybrid cable comprises:
- an electric connecting element disposed at one end for the portable main device for releasable connection to the first electric connection assembly of the portable main device,
- an electric connecting element arranged at a different end for the portable additional device for releasable connection to the second electric connection assembly of the portable additional device,
- at least one wire for transmitting the power signal between the portable main device and the portable additional device;
- at least one wire for data communication between the portable main device and the portable additional device; and
- at least one wire for transmitting a safety signal between the portable main device and the portable additional device.

17. The test system according to claim 16, wherein the hybrid cable is configured for use in a test system for testing an electric high-voltage device.

18. The test system according to claim 16, wherein the hybrid cable comprises a cable sheath that (i) at least in a middle section of the hybrid cable between the one end and the different end encases the at least one wire for transmitting power together with the at least one wire for data communication, (ii) at the one end encases the at least one wire for transmitting power separately from the at least one wire for data communication, and (iii) at the different end encases the at least one wire for transmitting power separately from the at least one wire for data communication.

* * * * *